(12) United States Patent
Radens et al.

(10) Patent No.: US 6,388,294 B1
(45) Date of Patent: May 14, 2002

(54) INTEGRATED CIRCUIT USING DAMASCENE GATE STRUCTURE

(75) Inventors: Carl Radens, LaGrangeville; Mary E. Weybright, Pleasant Valley; Gary Bronner, Stormville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 09/718,571

(22) Filed: Nov. 22, 2000

Related U.S. Application Data

(62) Division of application No. 09/352,318, filed on Jul. 12, 1999, now Pat. No. 6,194,301.

(51) Int. Cl.$^7$ .................. H01L 29/76; H01L 31/062
(52) U.S. Cl. .................. 257/368; 257/346; 257/383; 257/384; 257/389; 257/390; 257/382
(58) Field of Search .................. 438/597, 238, 438/239, 241, 253, 396, 592, 648–656, 663–666, 682–685; 257/368, 382, 383, 384, 389, 390, 346

(56) References Cited

U.S. PATENT DOCUMENTS

| | | |
|---|---|---|
| 5,077,228 A | 12/1991 | Eklund et al. |
| 5,130,782 A | 7/1992 | Ashwell |
| 5,451,804 A | 9/1995 | Lur et al. |
| 5,525,531 A | 6/1996 | Bronner et al. |
| 5,571,738 A | 11/1996 | Krivokapic |
| 5,610,083 A | 3/1997 | Chan et al. |
| 5,707,896 A | 1/1998 | Chiang et al. |
| 5,731,239 A | 3/1998 | Wong et al. |
| 5,767,005 A | 6/1998 | Doan et al. |
| 5,786,256 A | 7/1998 | Gardner et al. |
| 5,789,294 A | 8/1998 | Choi |
| 6,153,459 A | * 11/2000 | Sun .................. 438/238 |

FOREIGN PATENT DOCUMENTS

JP     5188394 A     7/1993

OTHER PUBLICATIONS

IBM TDB TFT damascene process, v32, n3B, Aug. 1989 p67.

* cited by examiner

Primary Examiner—Matthew Smith
Assistant Examiner—Igwe U. Anya
(74) Attorney, Agent, or Firm—Daryl K. Neff; Cantor Colburn LLP

(57) ABSTRACT

An integrated circuit device is presented. The integrated circuit device of the present invention comprises a semiconductor substrate having a combination of transistor gates formed using a conventional dielectric-capped gate stack for self-aligned diffusion contacts (SAC) as well as a transistor gate structure formed by removing the dielectric-cap gate stack from selected regions of the semiconductor substrate and replacing the dielectric-cap gate stack with a second gate conductor which is patterned using a damascene process.

10 Claims, 15 Drawing Sheets

INTEGRATED CIRCUIT USING DAMASCENE GATE STRUCTURE

CROSS REFERENCE OF RELATED APPLICATIONS

The present application is a divisional application of application Ser. No. 09/352,318, Jul. 12, 1999, now issued U.S. Pat. No. 6,194,301, the contents of which are incorporated herein by reference.

FIELD OF THE INVENTION

The present invention relates to the fabrication of integrated circuits on semiconductor substrates, and more specifically, the present invention relates to a method for fabricating an integrated circuit having a combination of transistor gate electrodes formed using conventional processing techniques and a damascene processing technique in accordance with the present invention.

BACKGROUND OF THE INVENTION

As greater and greater number of devices and circuits become possible on semiconductor integrated circuits, the desire to integrate more system function onto a single chip grows as well. Logic circuits process, while memory circuits store, information, and the two are used in tandem to add "intelligence" to electronic products. The two functions have been provided on separate chips, adding complexity and cost to the final product. There is an increasing need to join both memory and logic circuits together on the same chip.

In the recent years, advances in the semiconductor process technologies have dramatically decreased the device feature size and increased the circuit density and performance on integrated circuit chips. One of the more common integrated circuit devices is a field effect transistor (FET) which is used extensively for Ultra Large Scale Integration (ULSI). Typically, these FETs are formed using a predetermined number of polysilicon gate electrodes and self-aligned source/drain contact areas. Conventional FETs are generally fabricated by patterning polysilicon gate electrodes over a thin gate oxide layer formed on a single crystal semiconductor substrate. This gate electrode structure is used as a diffusion or implant barrier mask to form self-aligned source/drain areas in the semiconductor substrate adjacent to the sides of the gate electrode. A channel is formed in the semiconductor substrate and includes a channel length which is defined as the distance from the source junction to the drain junction under the gate electrode.

With the advent of Large Scale Integration (LSI) many of the integrated circuits formed on semiconductor substrates are comprised of several circuit functions on a single chip. For example, dynamic random access memory (DRAM), nonvolatile memory (NVM), and similar memory devices are composed of an array of memory cells for storing digital information, while the peripheral circuits on these devices are typically formed of logic circuits for addressing the memory cells, with other peripheral circuits functioning as read/write buffers and sense amplifiers.

The FET of a semiconductor integrated circuit controls current conduction from a source region to a drain region by application of voltage to a gate conductor. If the gate conductor is insulated from the source-drain conduction channel, the device is called an insulated gate FET. The most common gate structure is that of metal oxide semiconductor (MOSFET).

Dopant atoms are introduced into MOSFETs for specific purposes such as to control threshold voltage, dope gate conductors, or to control substrate currents, with adverse side effects accepted as necessary by-products of dopant atom introduction.

The technology for dynamic random access memory (DRAM) circuits is optimized for density and low cost while the technology for high-speed logic functions may require dual work function gate conductor polysilicon transistor types which incorporate n-type or p-type dopants within the gate conductor of the transistor. This places additional problems of complexity and cost on the fabrication process.

Memory circuits achieve increased packing density with self-aligned diffusion contacts within the array. Gate structures used in conventional integrated circuit devices are typically of the same type throughout the integrated circuit device. For example, typical DRAM transistor gates are formed using a conventional dielectric-capped gate stack for self-aligned diffusion contacts (SAC). However, these conventional gate stacks preclude the formation of self-aligned silicide (salicide) layers which reduce resistance and improve device performance. Consequently, it would be advantageous and desirable to be able to employ two separate types of gate structures within the integrated circuit device to improve performance and be able to better tailor the electrical, chemical, and mechanical characteristics of the integrated circuit device.

SUMMARY OF THE INVENTION

The above-discussed and other drawbacks and deficiencies of the prior art are overcome or alleviated by the integrated circuit device of the present invention. The integrated circuit device comprises a semiconductor substrate having a combination of transistor gates formed using a conventional DRAM dielectric-capped gate stack for self-aligned diffusion contacts (SAC) as well as a transistor gate structure formed by selectively removing the dielectric-capped gate stack from selected regions of the semiconductor substrate and replacing the dielectric-capped gate stack with a second gate conductor which is preferably patterned using a damascene process. Accordingly, this second gate conductor is referred to as a damascene gate structure.

The integrated circuit of the present invention provides improved support device transistor performance by enabling the incorporation of dual work function doping along with self-aligned diffusion contacts, salicide gates, and dual gate oxide thickness devices. In addition, the process of forming the damascene gate structure of the present integrated circuit device provides an accessible self-aligned channel region generally below the damascene gate conductor. This accessibility to the self-aligned channel region permits greater flexibility in the formation of the damascene gate structure and the self-aligned channel region may be modified, e.g., by an ion implementation process, independently of source/drain ion implementation.

In another aspect, because a damascene process is preferably used to form the second gate conductor, a thin gate dielectric layer, e.g., oxide layer, which comprises a portion of the second gate conductor is selected independent from the first thin gate dielectric layer which forms a portion of the conventional first dielectric-capped gate stack. Independent control of the second thin gate dielectric layer, including the thickness thereof, results in improved performance and reliability in the integrated circuit device of the present invention.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
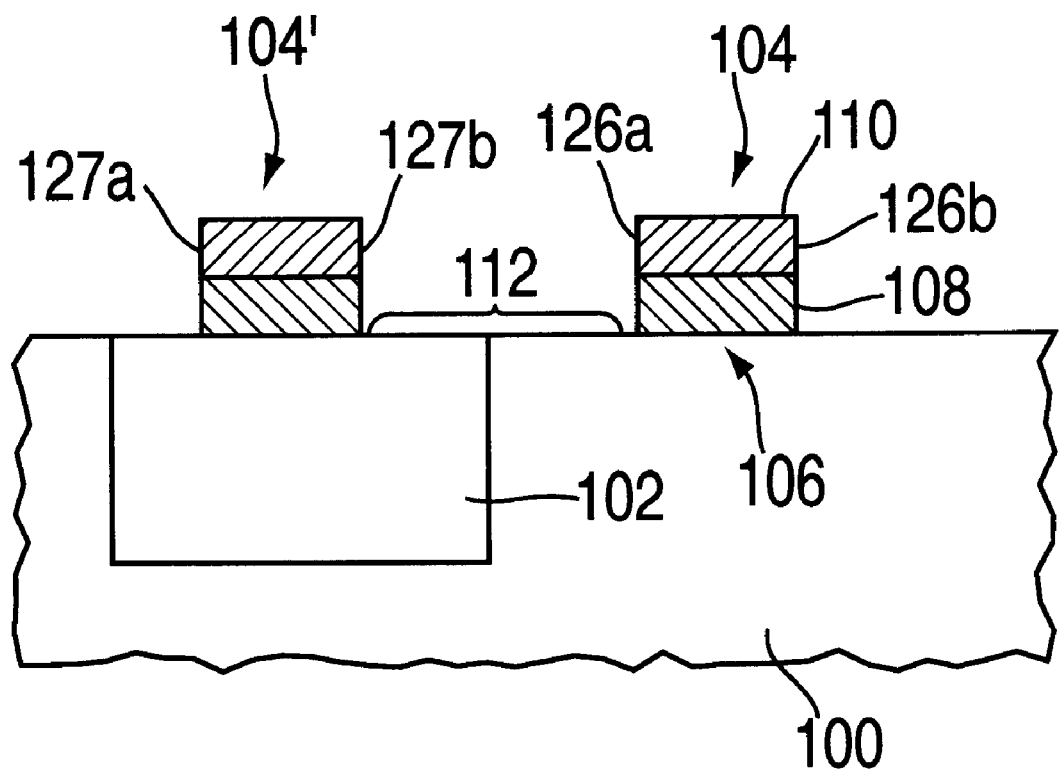
FIGS. 1–15 show schematic cross-sectional views depicting the structure of an integrated circuit device of the present invention at various stages in the process of the present invention.

Referring to FIG. 1, a partial cross-sectional view of a semiconductor substrate 100 is shown. Semiconductor substrate 100 comprises substrate materials known in the art and in an exemplary embodiment comprises single crystal silicon. Semiconductor substrate 100 includes a well region 102 preferably formed using masked ion implatation. In a process sequence shown in FIGS. 2–5, a first gate dielectric stack 104 is formed on semiconductor substrate 100. In a preferred embodiment, first gate dielectric stack 104 includes a thin gate dielectric layer 106 formed on an upper surface of semiconductor substrate 100 and a gate conductor 108 formed on an upper surface of thin gate dielectric layer 106. Preferably, thin gate dielectric layer 106 comprises a gate oxide layer. A gate cap dielectric 110 is formed on an upper surface of gate conductor 108. Preferably, gate oxide layer 106 comprises a layer of silicon dioxide having a thickness of about 3 nm to about 100 nm and gate oxide layer 106 is typically grown by a thermal oxidation process, as is known in the art. Gate conductor 108 may be formed of LPCVD (low pressure chemical vapor deposition) polysilicon and gate cap dielectric 110 is preferably formed of LPCVD SiN.

As shown in the FIGURES, semiconductor substrate 100 includes a predetermined number of first gate dielectric stacks 104 at selected regions of semiconductor substrate 100. For the purpose of illustration, FIG. 1 shows only two first gate dielectric stacks 104 and 104'. Gate dielectric stack 104 acts as a first transistor and gate dielectric stack 104' acts as a place holder for a second transistor in the integrated circuit device of the present invention. First gate dielectric stack 104' comprises thin gate dielectric layer 106', gate conductor 108' and a gap cap dielectric 110'.

Figure 2:
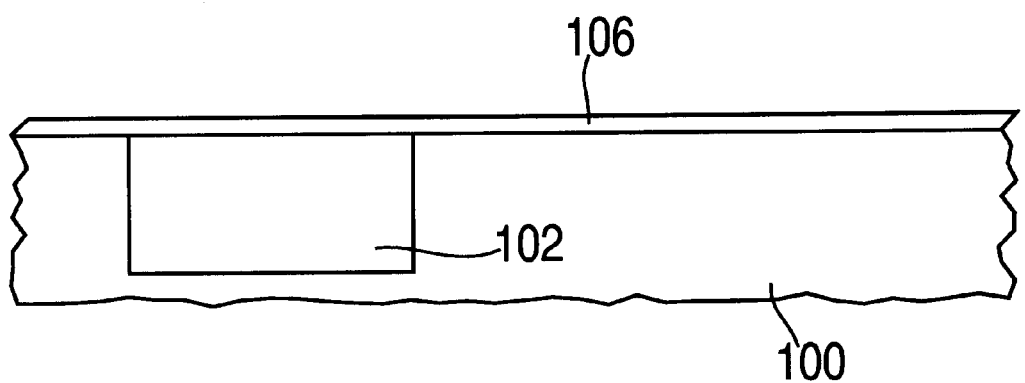
Figure 3:
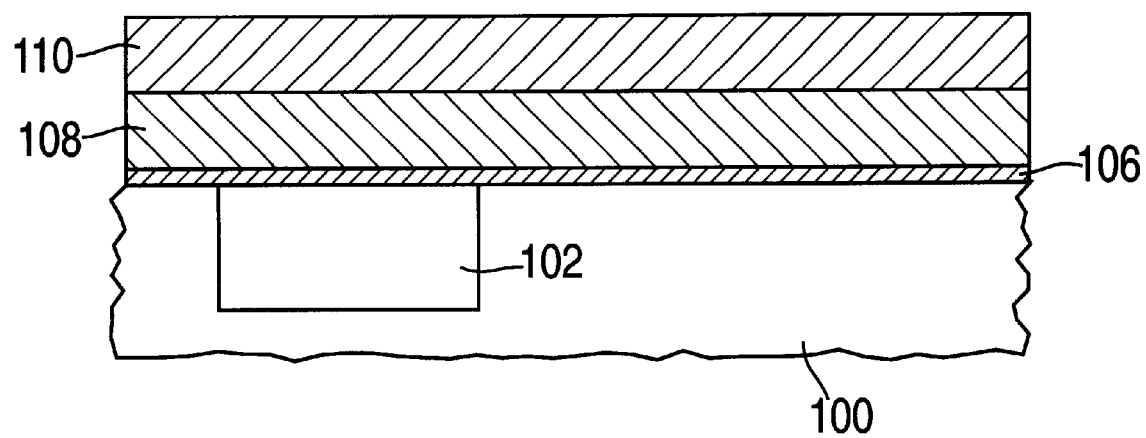

After first gate dielectric stack 104 is formed on semiconductor substrate 100, first gate dielectric stack 104 is patterned to expose a target region 112 of semiconductor substrate 100. FIGS. 2–5 depict a preferred and exemplary process sequence for forming and patterning first gate dielectric stack 104. FIG. 2 shows semiconductor substrate 100 upon which gate oxide layer 106 has been formed. FIG. 3 shows the formation of first gate dielectric stack 104, which comprises gate oxide layer 106, gate conductor 108, and gate cap dielectric 110. It is to be understood that first gate dielectric stack 104 may be formed of other dielectric materials suitable for the present process sequence.

Figure 4:
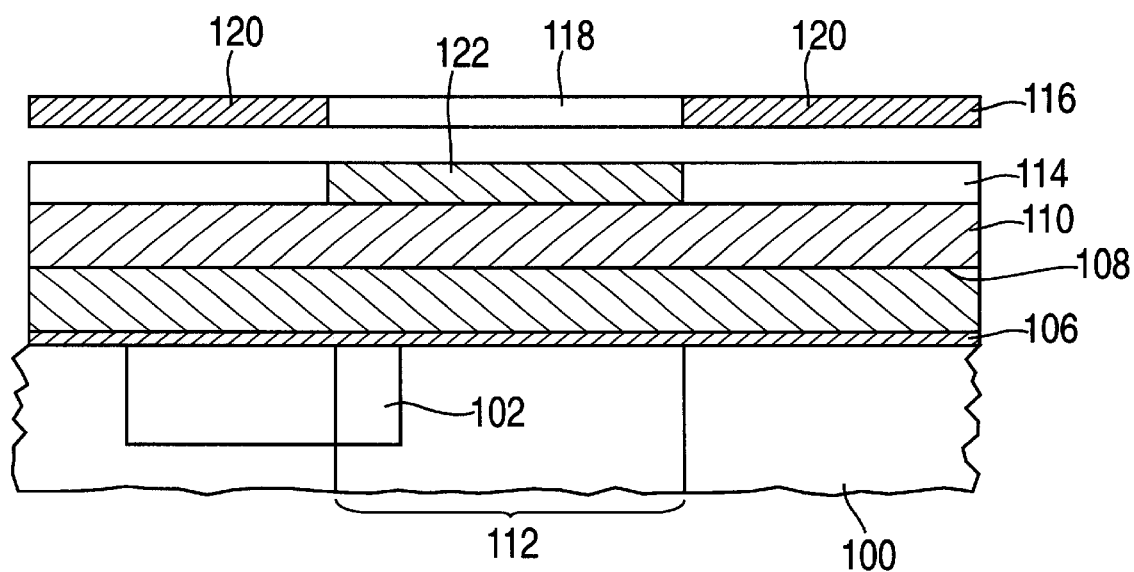
Figure 5:
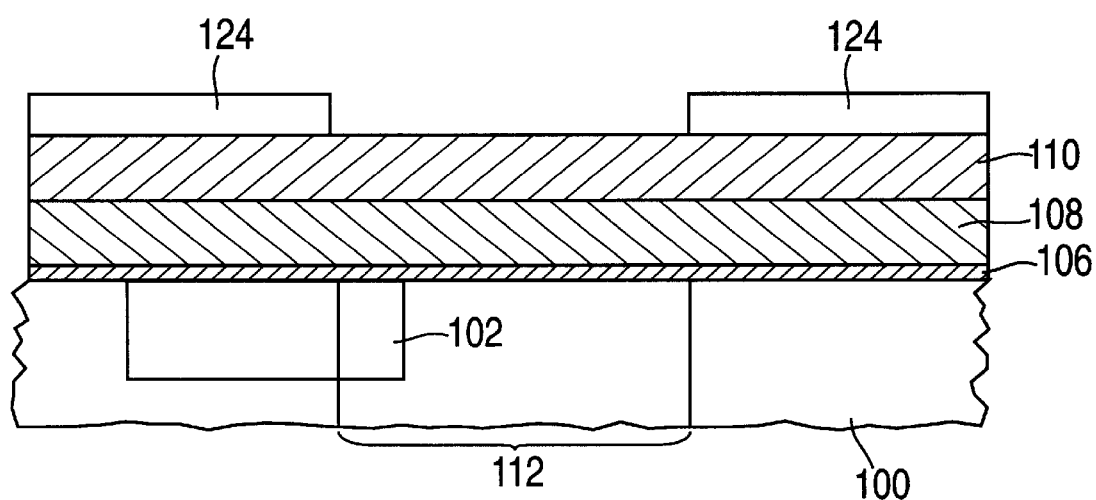

Turning to FIG. 4, a photoresist layer 114 is deposited upon an upper surface of first gate dielectric stack 104. Photoresist layer 114 is thereafter selectively exposed to radiation which is preferably emitted from a photolithography apparatus. A photomask 116 comprising a transmissive region 118 and opaque regions 120 is used during the patterning process. As is known in the art, photomask 116 is often referred to as a fine line mask and the masking process of FIG. 3 is referred to as a critical lithography masking process. Photomask 116 is very costly and therefore, the multiple use of such fine line masks in the integrated circuit devices of the prior art greatly increases the overall cost of fabricating the device. This photo process results in exposed region 122 within photoresist layer 114. In the preferred embodiment illustrated in the FIGURES, exposed region 122 is laterally aligned with target region 112 of semiconductor substrate 100. In FIG. 5, exposed region 122 (not shown) of photoresist layer 114 has been removed to form patterned photoresist layer 124. Patterned photoresist layer 124 exposes an upper surface of first gate dielectric stack 104. The exposed region of first gate dielectric stack 104 is aligned with target region 112. Returning to FIG. 1, the portions of first gate dielectric stack 104 within the lateral boundaries of target region 112 are removed using conventional techniques such that an upper surface of target region 112 is exposed. This patterning forms first gate dielectric stacks 104 and 104' with target region 112 extending therebetween and results in formation of opposing side walls 126a and 126b of first gate dielectric stack 104 and opposing side walls 127a and 127b for first gate dielectric stack 104'.

Figure 6:
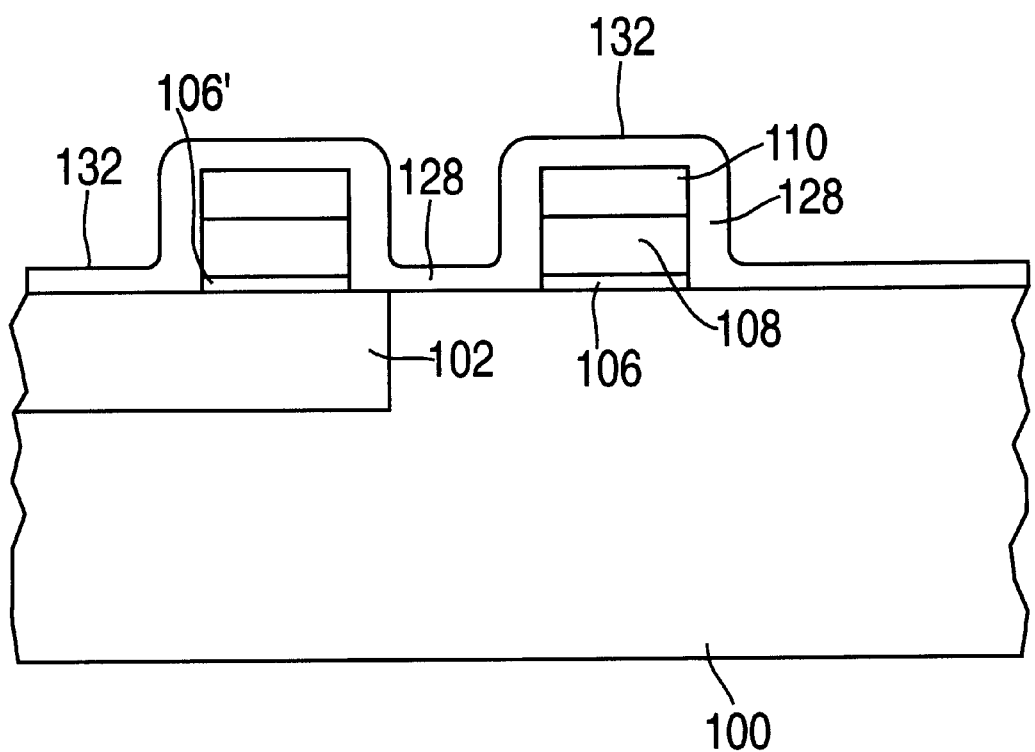
Figure 7:
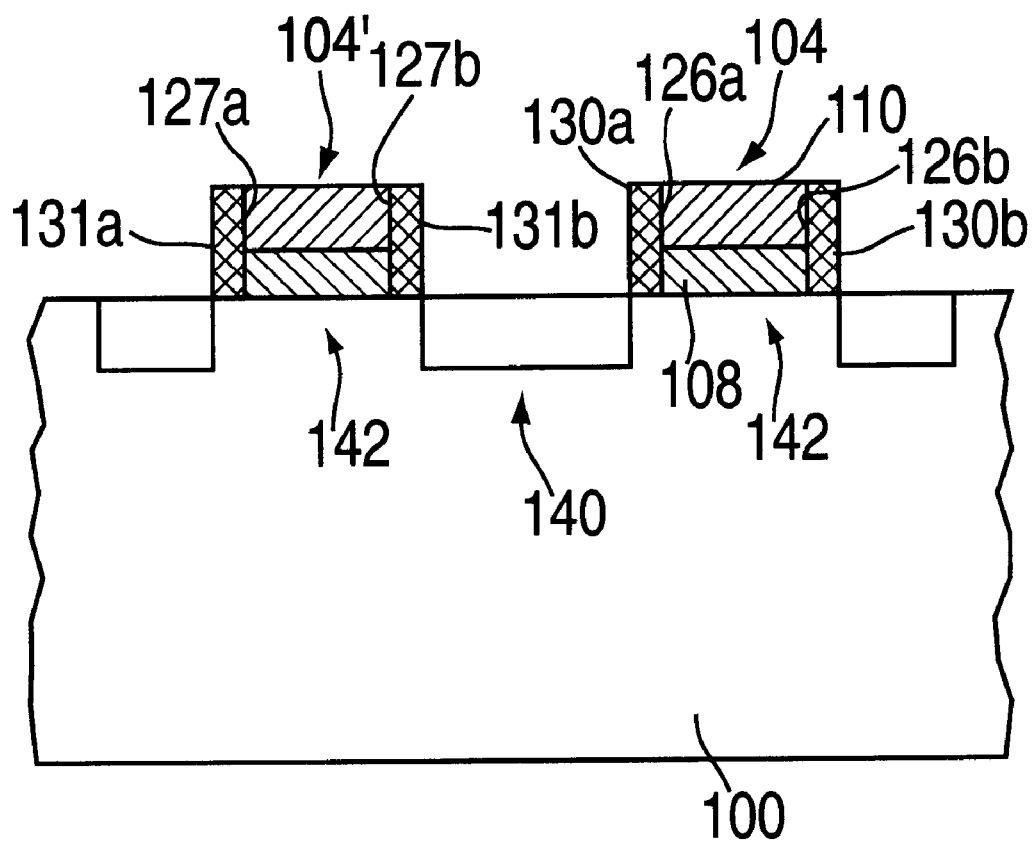

Turning now to FIG. 6, sidewall spacer material 128 is deposited upon patterned first gate dielectric stack 104 and semiconductor substrate 100. In a preferred embodiment, sidewall spacer material 128 comprises a known spacer material, such as LPCVD SiN. One exemplary processing technique for depositing sidewall spacer material 128 is a conformal deposition process. Turning to FIG. 7, a pair of first spacers 130a and 130b are formed on the opposing side walls 126b and 126a, respectively, and a pair of second spacers 131a and 131b are formed on opposing side walls 127a and 127b of dielectric stack 104'. The formation of first spacers 130a and 130b is preferably accomplished by anistropically etching (RIE) sidewall spacer material 128 until sidewall spacer material 128 is removed from planar horizontal surfaces 132 (shown in FIG. 6) while overetching is minimized. Accordingly, the anistropical etching of sidewall spacer material 128 does not remove the material from the vertical side walls 126a, 126b, 127a, and 127b. The formation of first spacers 130a and 130b and second spacers 131a and 131b is well known in the art.

In addition a source/drain diffusion region 140 is formed in semiconductor substrate 100 preferably by using an ion implantation technique after first spacers 130a and 130b and second spacers 131a and 131b are formed. Source/drain region 140 is laterally disposed between first gate dielectric stacks 104 and 104' as shown in FIG. 7. Formed in semiconductor substrate 100 and laterally disposed between source/drain regions 140 is a channel region 142. In a preferred embodiment, channel region 142 is laterally aligned with target region 112 of semiconductor substrate 100. The formation of source/drain regions, such as source/drain regions 140, is well known in the semiconductor fabrication field.

Figure 8:
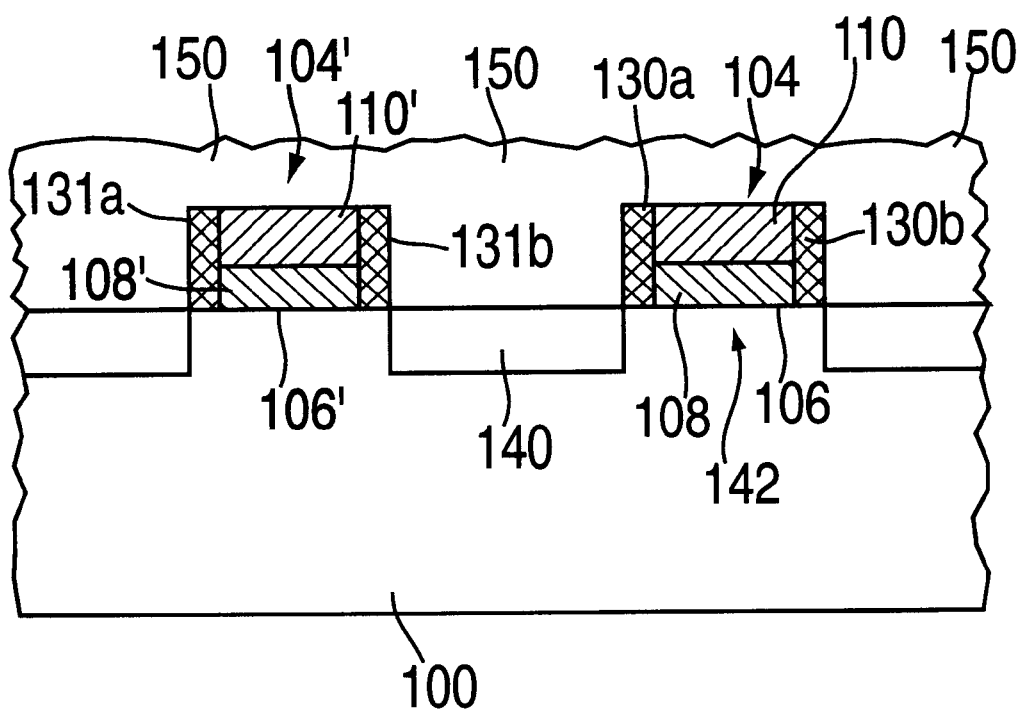
Figure 9:
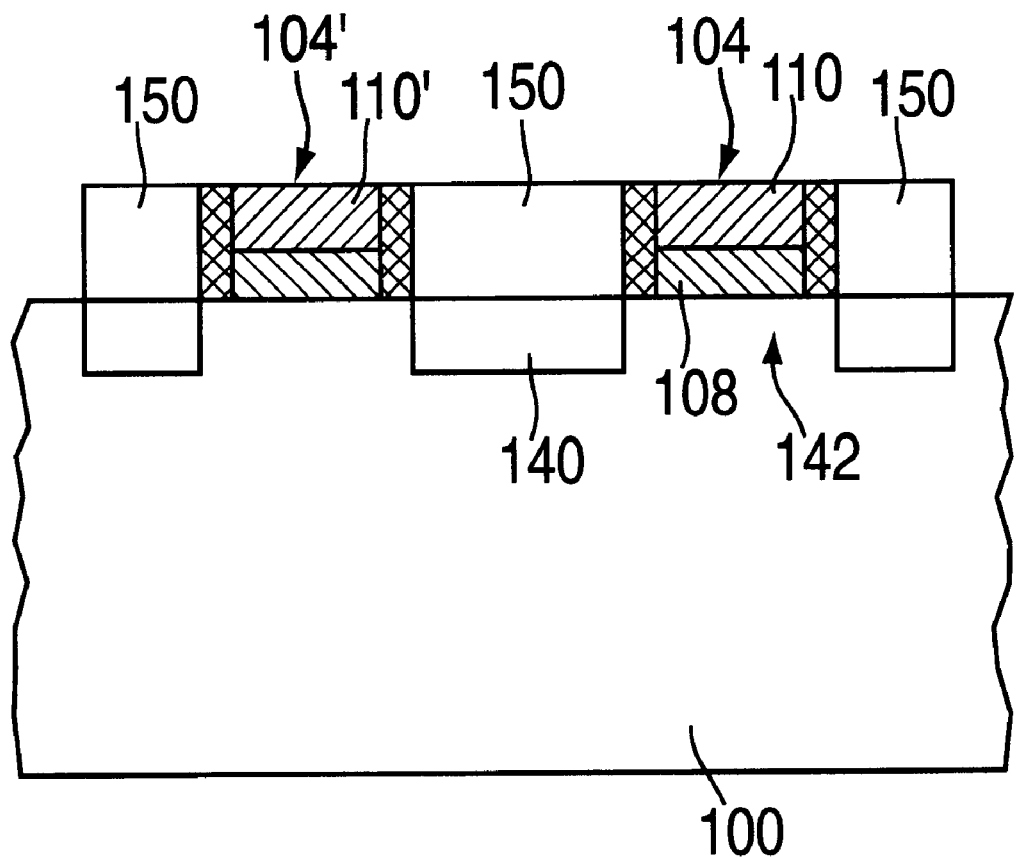

Turning now to FIG. 8, an interlevel dielectric 150 is blanket deposited upon patterned first gate dielectric stacks 104 and 104' and semiconductor substrate 100. In a preferred embodiment, interlevel dielectric 150 comprises boron and phosphorous doped silicate glass (BPSG) using conventional deposition techniques. Turning to FIG. 9, interlevel dielectric 150 is planarized preferably with a chemical mechanical polish (CMP), possibly in combination with photomask steps and dry etch steps so that interlevel dielectric 150 is planarized to the surface of gate cap dielectrics 110 and 110'. In other words, interlevel dielectric 150 has an upper surface that is substantially planar with an upper surface of gate cap dielectrics 110 and 110'.

Figure 10:
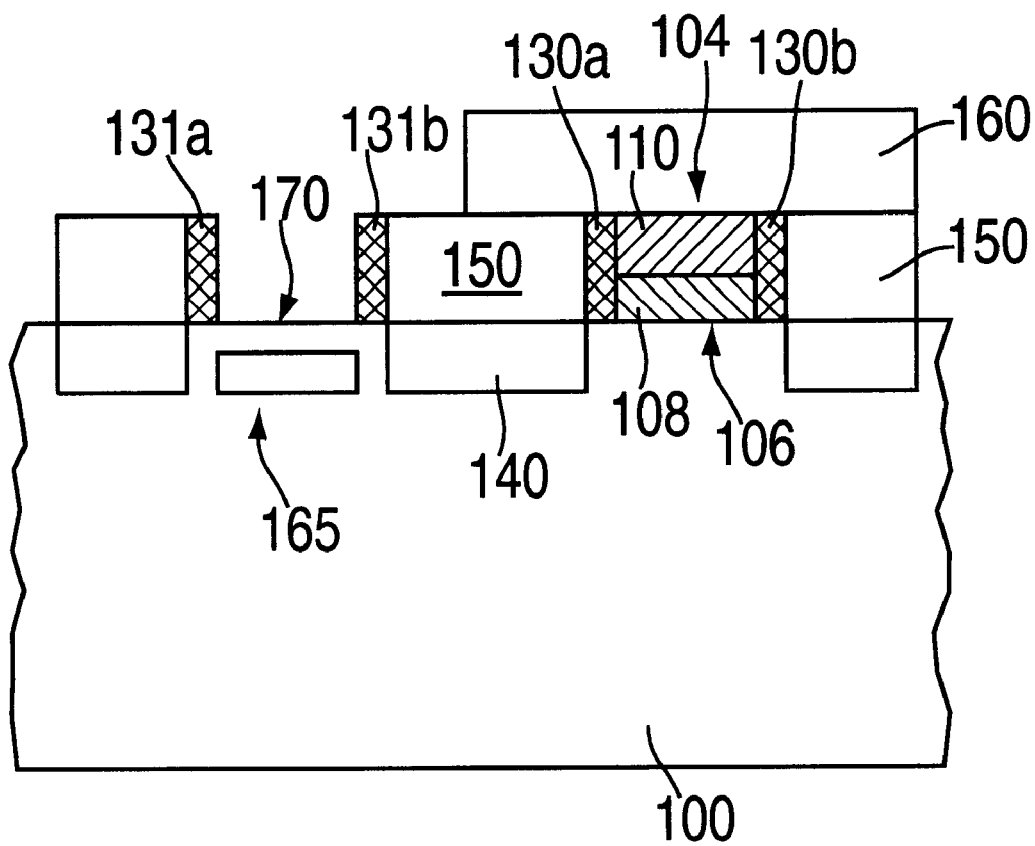

Turning to FIG. 10, a process sequence is shown in which a block mask 160 is disposed on the upper surfaces of first gate dielectric stack 104, interlevel dielectric 150 and first spacers 130a and 130b. More specifically, block mask 160 is disposed on preselected surfaces which comprise regions which are to be protected during a subsequent etching process. Block mask 160 comprises a course block mask which is significantly less expensive than fine line photomask 116 of FIG. 3. Thus by using course block mask 160, the present invention limits the use of fine line photomasks and critical lithography masking techniques and accordingly, the present invention reduces the overall fabrication costs for forming the integrated circuit device of the present invention. After masking the regions to be protected, the remaining unprotected regions are etched subjected to an etching process. More specifically, gate oxide layer 106', gate conductor 108', and gate cap dielectric 110' in the unprotected, non-masked region are removed during the etching process so that the semiconductor substrate 100 is exposed in the unprotected region. In an exemplary embodiment, a solution containing phosphoric acid may be used to remove gate cap dielectric 110' selectively to interlevel dielectric 150 and gate conductor 108' and a $Cl_2$ containing plasma may be used to remove gate conductor 108' to gate oxide layer 106'. As shown, the second spacers 131a and 131b remain intact during the etching process. Gate oxide layer 106' is preferably etched using an HF (hydrofluoric)-containing solution and as shown in FIG. 10, a second thin gate dielectric layer 170 is formed in the position where first gate oxide layer 106' (not shown) was disposed between second spacers 131a and 131b. Preferably, second thin dielectric layer 170 comprises a second gate oxide layer 170 which is grown using thermal oxidation techniques.

In one aspect of the present invention, the material comprising second gate oxide 170 may be independently selected upon the desired setting and performance of the integrated circuit device. In other words, the thickness and material itself of second gate oxide 170 may be selected independent from first gate oxide 106. Independent control of the thickness of gate oxide 170 permits improved performance and reliability to be accomplished in the integrated circuit device. Furthermore, the structure of FIG. 10 permits the independent selection of the formation conditions of second gate oxide 170 for different selected regions of semiconductor substrate 100. Thus, the present invention permits optimization of thickness and formation conditions for different selected regions of semiconductor substrate 100.

A self-aligned channel region 165 may be formed under the gate pattern dielectric preferably using ion implementation (I/I) techniques. In yet another aspect of the present invention, self-aligned channel region 165 is disposed generally below second gate oxide 170. During the ion implementation (I/I) techniques used to form self-aligned channel 165, impurities may be introduced therein and because of the location of self-aligned channel 165, generally below second gate oxide 170, the characteristics of the second transistor may be changed depending upon the setting and/or desired performance of the integrated circuit device. Unlike conventional processing of integrated circuit devices, the present invention provides access to self-aligned channel region 165 during formation of the second transistor (second gate dielectric stack 200). Because self-aligned channel region 165 is exposed during the process, greater flexibility in the fabrication of the second transistor is provided. Other physical, chemical, and electrical modifications to self-aligned channel region 165, in addition to those mentioned hereinbefore, are permitted because of the access to self-aligned channel region 165.

In yet another feature of the present invention, second spacers 131a and 131b shown in FIG. 10 may be optionally modified for self-aligned sublithiographic channel 165. Second spacers 131a and 131b may optionally be removed by conventional techniques and replaced with second spacers 131a' and 131b' (not shown) for altering the performance characteristics of the device. For example, the thickness of second spacers 131a and 131b may be varied, e.g, increase thickness. By increasing the thickness of second spacers 131a and 131b, the length of self-aligned channel 165 is reduced. This results in increased device performance due to increasing the speed of the second transistor (second gate dielectric stack 200 shown in FIG. 11). Advantageously, the present process provides access to the second spacers 131a and 131b and consequently, second spacers 131a and 131b may be easily removed and replaced with second spacers 131a' and 131b' which are of a different thickness or material or the like from second spacers 131a and 131b. Alternatively, the material comprising second spacers 131a' and 131b' may remain the same, while the thickness is varied, Now turning to FIG. 11 which shows the present structure after a second gate conductor 175 has been deposited and planarized by a process which is commonly referred to as damascene chemical mechanical polishing (CMP). Accordingly, an upper surface of second gate conductor 175 is planar with the upper surface of interlevel dielectric 150 and dielectric stack 104. Second gate conductor 175 is formed between second spacers 131a and 131b. The process for forming second gate conductor 175 is commonly referred to as a damascene process. The second transistor of the present device comprises a second gate dielectric stack 200 which includes second gate conductor 175 and second gate oxide 170. Because second gate conductor 175 comprises an integral component of the second transistor (second gate dielectric stack 200), the present invention teaches the use of a damascene process to form a transistor of the integrated circuit device. Accordingly, second gate dielectric stack 200 may be referred to as a damascene gate structure. It being understood that it is within the scope of the present invention that other processes may be used to form second gate dielectric stack 200.

Optionally, second gate conductor 175 may be doped in selected regions of second gate conductor 175 preferably by a photoresist-masked ion implantation to tailor the present device transistor electrical characteristics by doping second gate conductor 175 either n-type or p-type to provide dual work function device types. More specifically, the integrated circuit device of the present invention may be tailored so that it contains n type conductors in selected regions and p type conductors in other selected regions, depending upon the desired performance and application. This optional feature of the present invention is not shown in the FIGURES.

Figure 11:
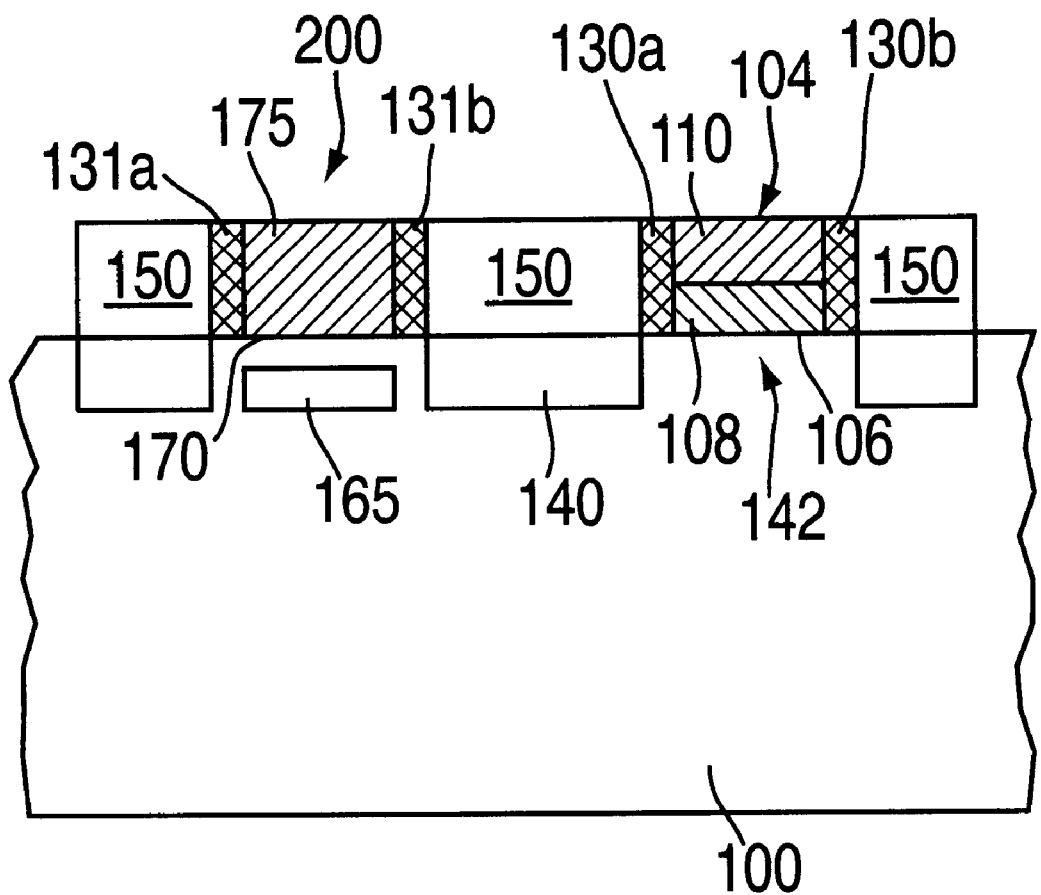
Figure 12:
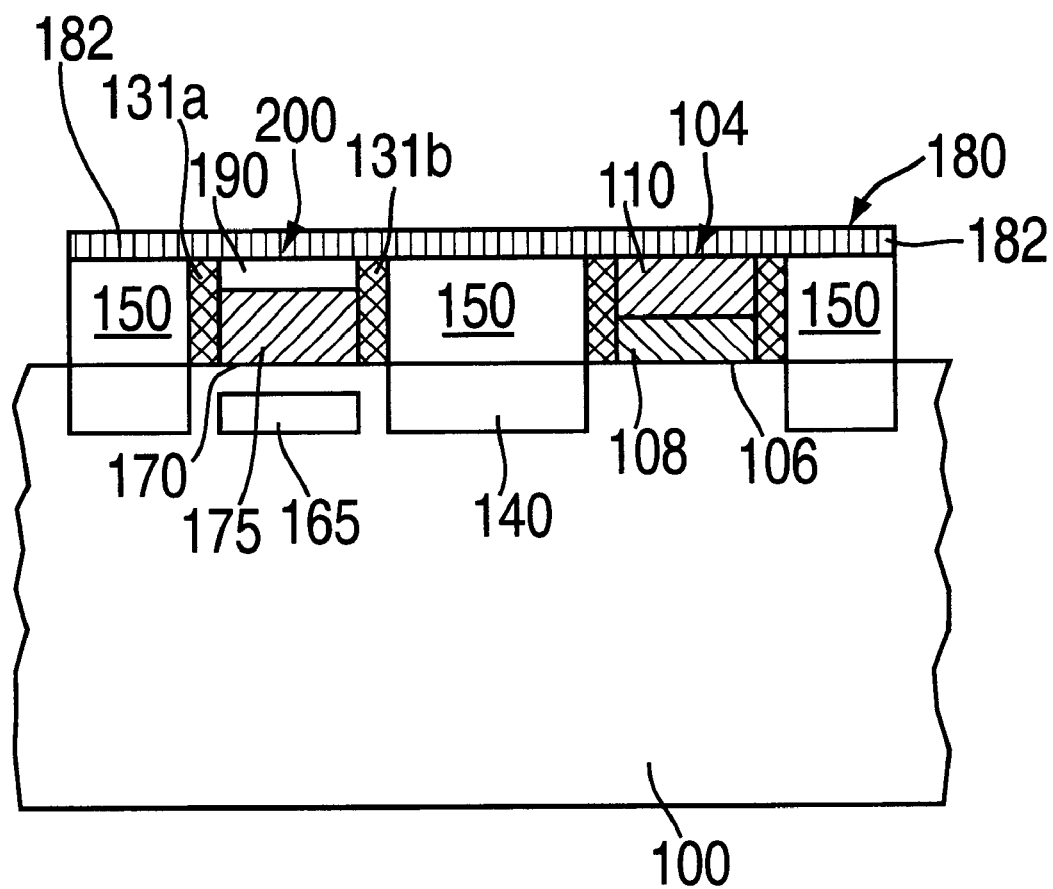

Turning to FIG. 12, a metal layer 180 is blanket deposited over the structure of FIG. 11 and is annealed so that the exposed second gate conductor 175 reacts with metal layer 180 to form a reacted metal salicide 190 on second gate dielectric stack 200. The salicide reduces resistance of second gate conductor 175 which improves performance of the integrated circuit device. Second gate dielectric stack 200 comprises second gate oxide 170 and second gate conductor 175. In regions where metal layer 180 does not react, a non-reacted metal layer 182 is formed. For example, non-reacted metal layer 182 is present over dielectric stack 104 and interlevel dielectric 150.

Figure 13:
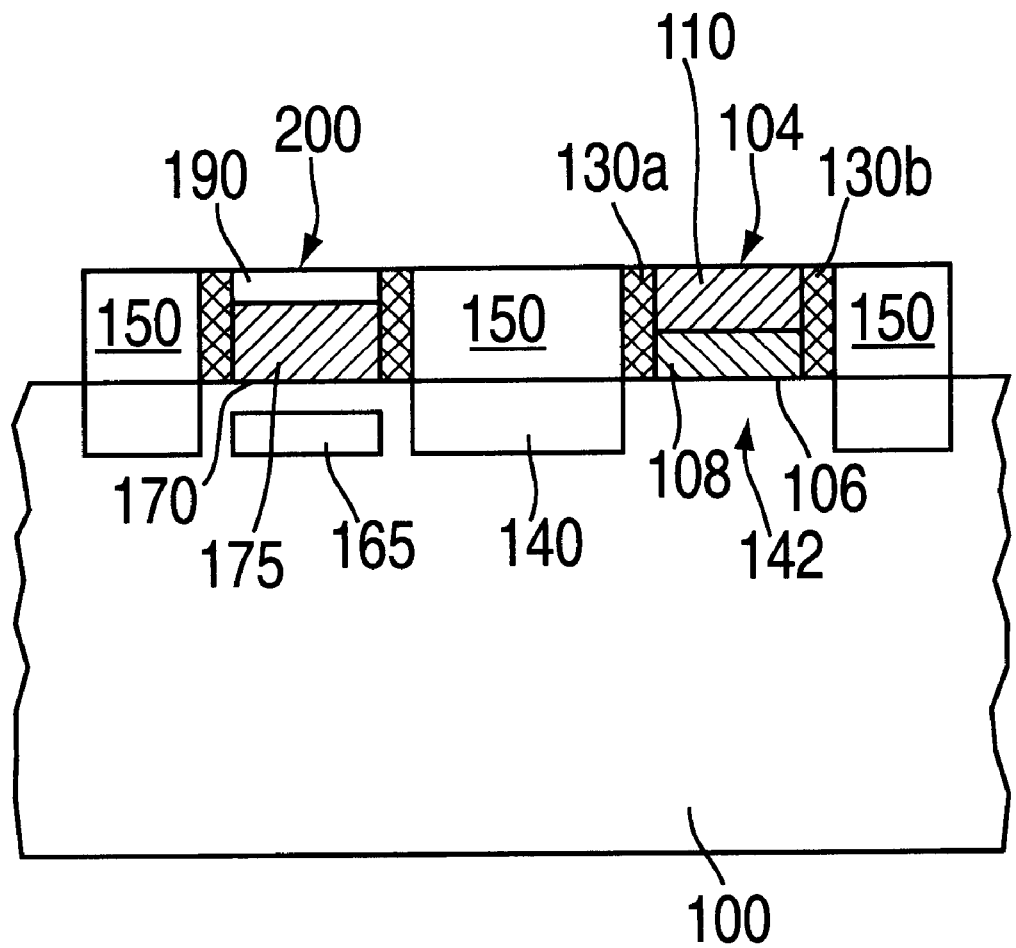

Turning to FIG. 13, the non-reacted metal layer (not shown) is etched from semiconductor substrate 100 using conventional etching techniques. In an exemplary embodiment, an HCl-containing solution is used for the etching process. The salicide remains over second gate dielectric stack 200 in the reacted regions of the device.

Figure 14:
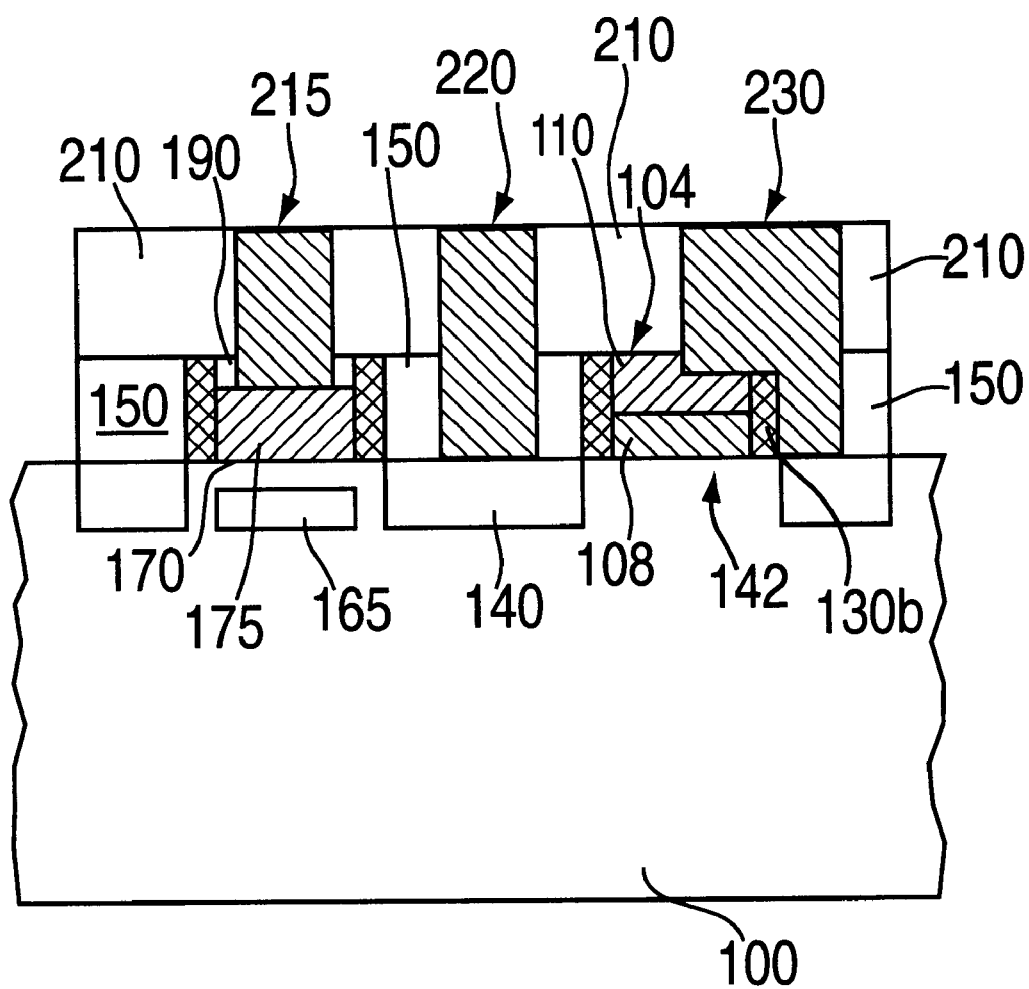

FIG. 14 illustrates the formation of contacts in the present device. A middle of the line (MOL) interlevel dielectric (ILD) 210 is formed upon the structure of FIG. 13 and more specifically, MOL ILD 210 is deposited upon dielectric stack 104, interlevel dielectric 150 and second gate dielectric stack 200. A contact to gate 215 and contact to diffusion 220 are formed using conventional processing techniques such as photolithography and RIE, conductive barrier and conductor deposition and CMP. A self-aligned diffusion contact 230 is formed and may partially overlap first gate dielectric stack 104 but will remain electrically isolated from the gate conductor region 108. More specifically and as illustrated in FIG. 14, self-aligned diffusion contact 230 partially overlaps first spacer 130b and gate cap dielectric 110 but does not overlap gate conductor 108 and is thereby electrically isolated therefrom. One advantage of having a self-aligned diffusion conductor is that a compact integrated circuit area is provided by the present structure. Self-aligned diffusion contact 230 is preferably formed using a dry etching process, such as RIE which has a high etch rate selectively to gate cap dielectric 110 and first spacers 130a and 130b.

Figure 15:
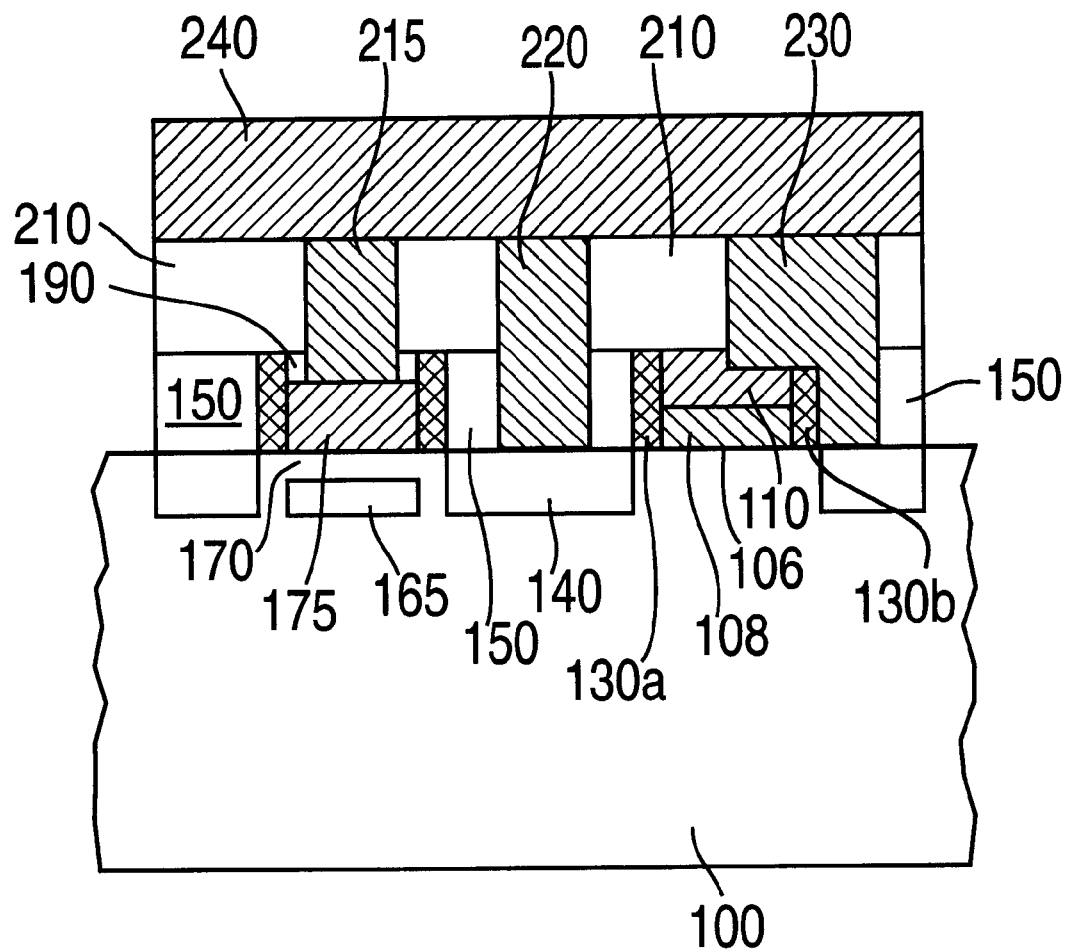

Now turning to FIG. 15, in which an interconnect wiring formation is shown for the device of the present invention. A wire level 240 is deposited upon MOL ILD 210 and contact structures 215, 220, and 230. Wire level 240 acts to provide a wiring formation to the gate structures of the present device by means of the contact structures 215, 220, and 230, as is known in the art.

Accordingly, the present invention discloses an integrated circuit device and process of fabrication thereof which permits the selective tailoring of semiconductor substrate 100 by selectively stripping at least one of first gate dielectric stacks 104, 104' to expose semiconductor substrate 100 at selected regions thereof. A second gate dielectric stack 200 is then formed in place of the stripped first gate dielectric stack 104, 104' which results in the improved ability to tailor the characteristics and performance of the integrated circuit device.

While preferred embodiments have been shown and described, various modifications and substitutions may be made hereto without departing from the spirit and scope of the invention. Accordingly, it is to be understood that the present invention has been described by way of illustrations and not limitation.

What is claimed is:

1. An integrated circuit device, comprising:
   a semiconductor substrate;
   first gate electrodes formed on the semiconductor substrate; and
   at least one second gate electrode formed at a selected region of the semiconductor substrate by stripping one of the first gate electrodes to the semiconductor substrate and forming the second gate electrode by a damascene process in place of the removed first gate electrode.

2. The device as in claim 1, further comprising:
   a well region formed within the semiconductor substrate;
   source/drain regions formed within the semiconductor substrate, the source/drain regions being adjacent to and self-aligned with the first gate electrodes and second gate electrode;
   first sidewall spacers formed on the first gate electrodes;
   a first interlevel dielectric layer deposited over the first gate electrodes and elsewhere on the semiconductor substrate, the first interlevel layer being planarized to upper surfaces of the first gate electrodes;
   a second interlevel dielectric layer deposited over the first and second gate electrodes and the first interlevel dielectric layer; and
   a plurality of contacts to form electrical interconnections over the well region, including the source/drain regions.

3. The device as in claim 1, wherein the semiconductor substrate includes first and second self-aligned channels formed therein generally below the first and second gate electrodes, respectively.

4. The device as in claim 3, wherein the plurality of contacts comprises a contact to the second gate conductor, a diffusion contact, and a self-aligned diffusion contact.

5. The device as in claim 3, wherein the self-aligned diffusion contact partially overlaps the gate cap dielectric layer of the first gate electrode.

6. The device as in claim 1, further comprising:
   first sidewall spacers formed adjacent to and self-aligned with the first gate electrodes; and
   second sidewall spacers formed adjacent to and self-aligned with the second gate electrodes.

7. The device as in claim 1, wherein the first gate electrode comprises:
   a first gate oxide layer formed on the semiconductor substrate;
   a first gate conductor deposited on the first gate oxide layer; and
   a gate cap dielectric layer deposited on the first gate conductor.

8. The device as in claim 1, wherein the second gate electrode comprises:
   a second gate oxide formed on the semiconductor substrate;
   a second gate conductor deposited on the second gate oxide; and
   a salicide layer formed on the second gate conductor.

9. The device as in claim 1, wherein the second gate electrode is formed by a damascene process.

10. The device as in claim 1, wherein the second gate electrode is formed in between sidewall spacers formed adjacent to and self-aligned with the removed first gate electrode.

* * * * *